US008558592B2

(12) United States Patent
Sreekiran et al.

(10) Patent No.: US 8,558,592 B2
(45) Date of Patent: Oct. 15, 2013

(54) CHARGE PUMP AND ACTIVE FILTER FOR A FEEDBACK CIRCUIT

(75) Inventors: Samala Sreekiran, Bangalore (IN); Ramesh Chettuvetty, Bangalore (IN)

(73) Assignee: Texas Instruments Incorporated, San Diego, CA (US)

( * ) Notice: Subject to any disclaimer, the term of this patent is extended or adjusted under 35 U.S.C. 154(b) by 158 days.

(21) Appl. No.: 13/020,798

(22) Filed: Feb. 3, 2011

(65) Prior Publication Data
US 2012/0200327 A1    Aug. 9, 2012

(51) Int. Cl.
*H03L 7/06*        (2006.01)

(52) U.S. Cl.
USPC .......................................... 327/157; 375/373

(58) Field of Classification Search
USPC ..................... 327/157, 156; 375/373
See application file for complete search history.

(56) References Cited

U.S. PATENT DOCUMENTS

| 5,487,093 | A  | * | 1/1996  | Adresen et al. | 375/376 |
| 5,783,971 | A  | * | 7/1998  | Dekker         | 331/17  |
| 5,936,445 | A  | * | 8/1999  | Babanezhad et al. | 327/157 |
| 6,909,312 | B2 | * | 6/2005  | Mitsumoto      | 327/141 |
| 7,005,929 | B2 | * | 2/2006  | Smith          | 331/17  |
| 7,078,948 | B2 | * | 7/2006  | Dosho          | 327/157 |
| 7,839,203 | B1 | * | 11/2010 | MacLean et al. | 327/540 |
| 2003/0038661 | A1 | * | 2/2003 | Chokkalingam et al. | 327/157 |
| 2004/0101081 | A1 | * | 5/2004 | Hsu | 375/376 |
| 2007/0090863 | A1 | * | 4/2007 | Hsu | 327/157 |

OTHER PUBLICATIONS

"Tai-Cheng Lee and Behzad Razavi", A Stabilization Technique for Phase-Locked Frequency Synthesizers, IEEE Journal of Solid-State Circuits, Vol. 38, No. 6, Year Jun. 2003, p. 888-894.

* cited by examiner

*Primary Examiner* — Ryan Jager
(74) *Attorney, Agent, or Firm* — Ronald O. Neerings; W. James Brady; Frederick J. Telecky, Jr.

(57) ABSTRACT

A circuit containing a pair of charge pumps and an active filter receives outputs of a phase frequency detector used in a phase locked loop. The charge pump is implemented using switches and resistors to reduce performance variations due to component mismatches. The loop filter includes a resistor and a capacitor coupled in series, the resistor and the capacitor determining a zero of the transfer function of the loop filter. The charge pump circuit simultaneously injects a first current pulse at a first node of the loop filter and a second current pulse at a second node formed by a junction of the resistor and the capacitor. The polarity of the first current pulse is the opposite of the polarity of the second current pulse. Multiplication of the capacitance of the capacitor is thereby achieved, enabling implementation of the loop filter in integrated circuit form.

6 Claims, 2 Drawing Sheets

CHARGE PUMP AND ACTIVE FILTER FOR A FEEDBACK CIRCUIT

BACKGROUND

1. Technical Field

Embodiments of the present disclosure relate generally to electronic filters, and more specifically to a charge pump and active filter for a feedback circuit.

2. Related Art

A feedback circuit is, generally, a circuit in which a portion of an output signal (e.g., output voltage or output current) of the circuit is combined with an input signal of the circuit. Examples of feedback circuits include phase-locked loops (PLL), delay-locked loops (DLL), etc. The portion of the output quantity that is fed back for combining with the input signal is termed a feedback signal. The feedback signal may be combined with the input signal in a suitable manner (for example, compared with, added to or subtracted from the input signal) to generate an error signal. A physical quantity proportional to the error signal may be generated by a corresponding component of the feedback circuit. The physical quantity may then be filtered and provided to a component that generates the output signal.

For example, in a PLL, the phase of an output clock (or a sub-multiple of the output clock) may be compared with a phase of an input clock. A phase-frequency detector (PFD) may receive the output clock and the input clock, and generate signals indicating whether the phase of the output clock leads or lags the phase of the input clock. A charge pump circuit receives the signals generated by the PFD, and generates positive and/or negative current pulses proportional to the pulse widths of the signals, based on whether the phase of the output clock leads or lags the phase of the input clock. A filter is typically used to perform low-pass filtering of the current pulses generated by the charge pump. The filter may be implemented using active components (components that require a power supply to operate), such as transistors, operational amplifiers, etc. The filtered signal may be provided as a control voltage to a voltage controlled oscillator (VCO), which generates the output signal, the frequency of the output signal being proportional to the control voltage.

Several embodiments of the present disclosure are directed to a charge pump and an active filter used in a feedback circuit.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A circuit includes a pair of charge pumps and a filter. A first charge pump in the pair comprises a first pair of switches and a first pair of resistors, a junction of the resistors in the first pair of resistors forming a first node. The first charge pump is operable to source or sink a current from the first node by operation of the first pair of switches. A second charge pump in the pair comprises a second pair of switches and a second pair of resistors, a junction of the resistors in the second pair of resistors forming a second node. The second charge pump is operable to source or sink a current from the second node by operation of the second pair of switches. The filter comprises of an impedance and a capacitor coupled in series between a third node and a fourth node of the filter. A junction of the impedance and the capacitor forms a fifth node of the filter. The first node is coupled to the third node and the second node is coupled to the fifth node.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

The drawing in which an element first appears is indicated by the leftmost digit(s) in the corresponding reference number.

DETAILED DESCRIPTION

Various embodiments are described below with several examples for illustration.

1. Example Environment

Figure 1:
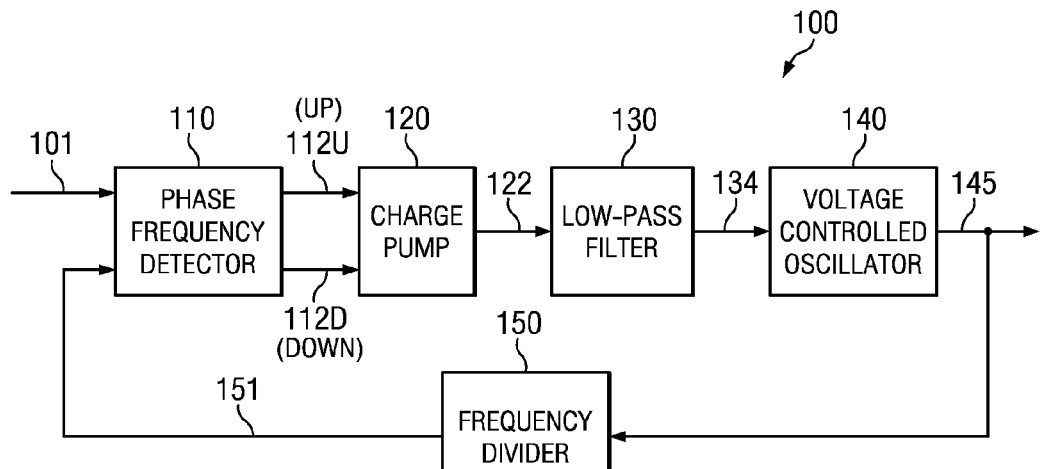
FIG. 1 is a block diagram of an example environment in which several embodiments can be implemented.

FIG. 1 is a block diagram illustrating an example environment in which several embodiments can be implemented. Phase locked loop (PLL) 100 of FIG. 1 is shown containing, phase frequency detector (PFD) 110, charge pump circuit 120, low-pass filter (LPF) 130, voltage controlled oscillator (VCO) 140 and frequency divider 150. The components and blocks of FIG. 1 are shown merely by way of illustration. Other PLL implementations may contain more or fewer components/blocks. Further, embodiments of the present disclosure can be implemented in other environments as well, such as feedback loops in general and negative feedback loops in particular. PLL 100 receives an input signal of frequency F1 on path 101, and generates an output signal of frequency F2, and having a same phase as input signal 101, on path 145. The ratio F2/F1 may be determined by a divide factor applied by frequency divider 150. PLL 100 may be implemented as an integrated circuit (IC).

PFD 110 compares the respective (instantaneous) phases of input signal 101 and feedback signal 151, and generates error signals UP and DOWN on paths 112U and 112D respectively. PFD 110 generates UP signal (112U) when the phase of input signal 101 leads (is ahead of) the phase of feedback signal 151. PFD 110 generates DOWN signal (112D) when the phase of input signal 101 lags (is behind) the phase of feedback signal 151. Typically, the pulse widths (durations) of the UP and DOWN signals are proportional to the phase difference between input signal 101 and feedback signal 151. The UP and DOWN signals respectively indicate whether VCO 140 needs to generate signal 145 with a higher or lower frequency.

Charge pump circuit 120 receives the UP (112U) and DOWN (112D) signals, and generates corresponding current pulses as outputs on path 122. Low-pass filter (LPF) 130 provides low-pass filtering of the current pulses on path 122, and generates a filtered signal on path 134. The filtered signal on path 134 represents a control voltage that is used to bias VCO 140 to generate an output signal of a corresponding frequency.

Voltage control oscillator (VCO) 140 generates a signal (e.g., sine wave or square wave) on path 145, the frequency and phase of signal 145 being dependant on the value of the control voltage on path 134. The signal on path 145 represents an output signal of PLL 100. In general, an UP signal from PFD 110 corresponds to VCO 140 increasing the frequency of output signal 145, and a DOWN signal from PFD 110 corresponds to VCO 140 decreasing the frequency of output signal 145.

Frequency divider 150 divides the frequency of signal 145 by a factor N, and provides a frequency-divided signal to PFD 110 on path 151. Frequency divider 150 may receive programming inputs (not shown) specifying the value of division factor (N) that is to be used in dividing the frequency of signal 145 to generate signal 151. At steady state (i.e., when PLL 100 is in a 'locked' state) output 145 of VCO 140 represents an output signal of PLL 100 with a desired frequency.

In an embodiment, PLL 100 is implemented as an analog PLL, with low-pass filter 130 and VCO 140 being implemented using analog components. In the embodiment, input signal 101 is a clock of frequency 32 KHz, and output signal 145 is a clock of frequency 500 MHz. However, in other embodiments, VCO 140 may be implemented using other approaches, such as, for example direct digital synthesis, with control voltage 134 also being converted to digital form.

2. Charge Pump Circuit and Filter

Figure 2:
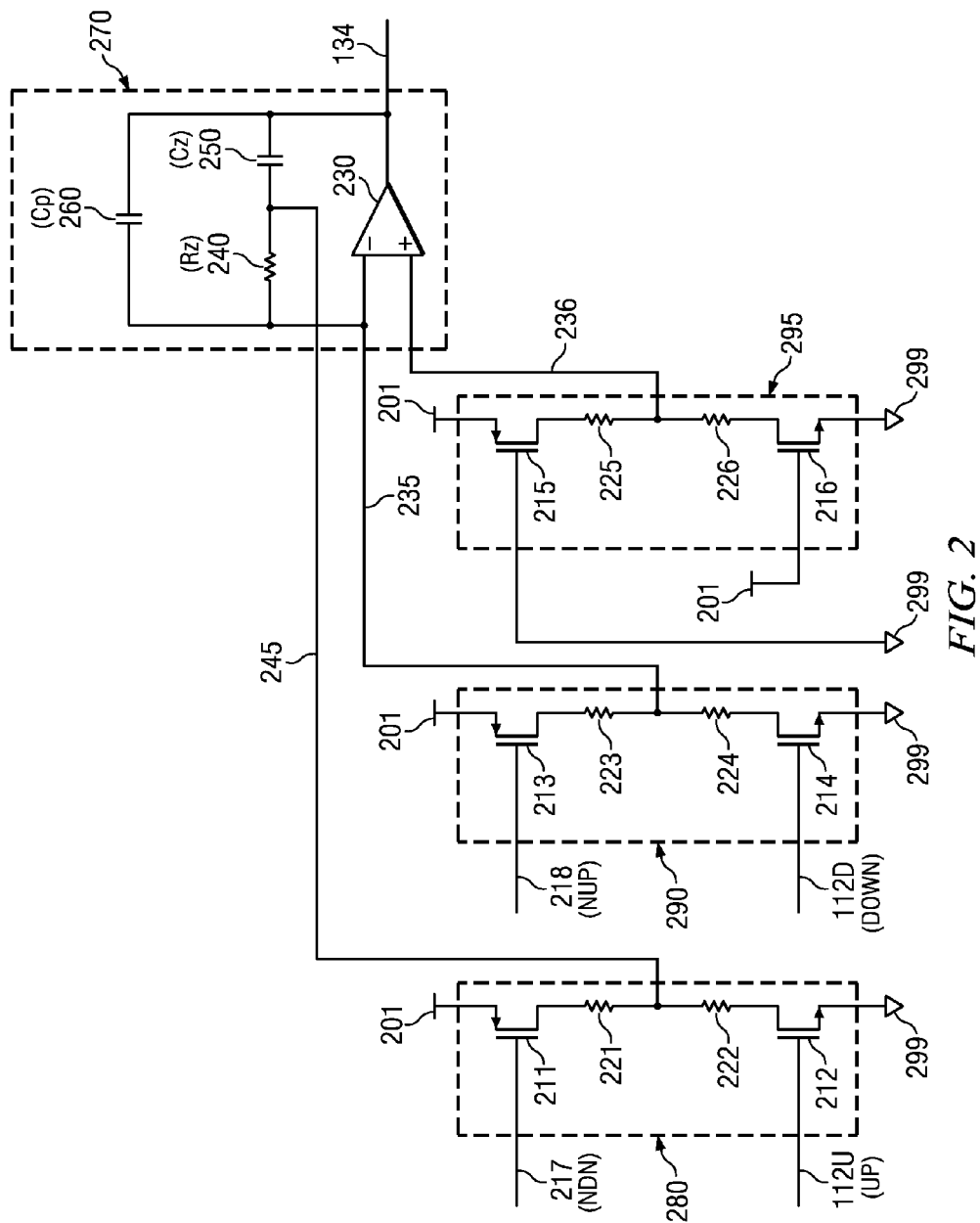
FIG. 2 is a diagram illustrating the implementation details of a charge pump and an active low-pass filter used in a feedback circuit, in an embodiment.

FIG. 2 is a diagram illustrating the details of charge pump circuit 120 and low-pass filter 130, in an embodiment. FIG. 2 is shown containing charge pumps 280 and 290, active filter 270 and common-mode voltage generator 295. The combination of charge pumps 280 and 290 represents charge pump circuit 120 of FIG. 1. The combination of active filter 270 and common-mode voltage generator 295 represents LPF 130 of FIG. 1. Terminals 201 and 299 respectively represent power supply and ground terminals.

Charge pump 280 (second charge pump) is shown containing P-channel MOS (PMOS) transistor 211 and N-channel MOS (NMOS) 212, and resistors 221 and 222. The source and drain terminals of transistor 211 are connected respectively to power supply terminal 201 and resistor 221. The gate terminal of transistor 211 is connected to signal 217 (NDN), which is the logical inverse of signal 112D (DOWN). The source and drain terminals of transistor 212 are connected respectively to ground 299 and resistor 222. The gate terminal of transistor 212 is connected to signal 112U (UP) generated by PFD 110. Resistors 221 and 222 are connected at junction node or path 245 (second node). Resistance values of resistors 221 and 222 are in the ratio 1:X, wherein X is a scaling factor, as clarified below. Transistors 211 and 212 constitute a second pair of switches, while resistors 221 and 222 constitute a second pair of resistors.

Charge pump 290 (first charge pump) is shown containing PMOS transistor 213 and NMOS 214, and resistors 223 and 224. The source and drain terminals of transistor 213 are connected respectively to power supply terminal 201 and resistor 223. The gate terminal of transistor 213 is connected to signal 218 (NUP), which is the logical inverse of signal 112U (UP). The source and drain terminals of transistor 214 are connected respectively to ground 299 and resistor 224. The gate terminal of transistor 214 is connected to signal 112D (DOWN) generated by PFD 110. Resistors 223 and 224 are connected at junction node 235 (first node). Resistance values of resistors 223 and 224 are also in the ratio 1:X. Signals 217 (NDN) and 218 (NUP) may be generated by inverters, not shown. Transistors 213 and 214 constitute a first pair of switches, while resistors 223 and 224 constitute a first pair of resistors.

Active filter 270 is shown containing operational amplifier (OPAMP) 230, resistor 240 and capacitors 250 and 260. Capacitor 260 is connected between the inverting input terminal (235) and output terminal (134) of OPAMP 230. Resistor 240 and capacitor 250 are connected in series between the inverting terminal (235) and output terminal (134) of OPAMP 230. Resistor 240 is connected between the inverting terminal of OPAMP 230 and junction node 245 (fifth node). Capacitor 250 is connected between node 245 and output terminal 134. Nodes 235 and 134 may be viewed respectively as a third node and a fourth node of active filter 230.

Common-mode voltage generator 295 is shown contain transistors 215 and 216, and resistors 225 and 226. The source and drain terminals of transistor 215 are connected respectively to power supply 201 and resistor 225. The source and drain terminals of transistor 216 are connected respectively to ground 299 and resistor 226. Resistors 225 and 226 are connected at node 236. The gate terminals of transistors 215 and 216 are respectively connected to ground 299 and power supply 201. Transistors 215 and 216 are therefore always ON. Resistance values of resistors 225 and 226 are in the ratio 1:X. Common mode voltage generator 295 generates a common-mode voltage (Vcm) at node 236, the voltage Vcm being dependant on power supply voltage 201 and the value X. The non-inverting terminal of OPAMP 230 is connected to node 236, and receives the common-mode voltage Vcm.

Active filter 270 operates as a low-pass filter. The transfer function of active filter 270 has a zero determined by the values of resistor 240 (Rz) and capacitor 250 (Cz). A pole in the transfer function of active filter 270 is determined by the value of the capacitance of capacitor 260 (Cp).

In an embodiment, PLL 100 (FIG. 1) is implemented as a low-bandwidth PLL. Implementation of PLL 100 as a low-bandwidth PLL (for example, to achieve very low jitter/noise in output clock 145) may require a zero in the transfer function of PLL 100 to be located at a relatively low frequency, for example, of the order of a few hundreds of Hertz (Hz). Therefore, capacitor 250 (Cz) may need to be implemented to have a relatively large capacitance. A large capacitance value for capacitor 250 may pose implementation problems such as large implementation area, at least when capacitor 250 is to be integrated on chip (i.e., within the IC that includes PLL 100). To work around the problem of large implementation area, charge pumps 280 and 290, and active filter 270 are implemented to achieve capacitance multiplication, i.e., the manner in which components of active filter 270 are connected to charge pumps 280 and 290 effectively results in a multiplication of the capacitance of capacitor 250, as described below.

Referring again to FIG. 2, each of transistors 211, 212, 213 and 214 is operated as a switch to be either ON or OFF. The 'output' of charge pump 290 is provided on node 235, and the 'output' of charge pump 280 is provided on path 245.

In operation, when signal 112U is at logic high, signal 218 (NUP) is at logic low, signal 112D (DOWN) is at logic low, and signal 217 (NDN) is at logic high. Transistor 212 is ON, while transistor 211 is OFF. Charge pump 280, therefore, sinks current from node 245. Transistor 213 is ON, while transistor 214 is OFF. Charge pump 290, therefore, sources current to node 235. Hence, while charge pump 290 injects a positive current proportional to a phase error between signals 101 and 151 into active filter 270, charge pump 280 injects a negative current (i.e., draws a current) proportional to the phase error from node 245 of active filter 270. Thus, the polarities of the currents injected simultaneously are opposite. In the description herein, a current flowing into active filter 270 is assumed (arbitrarily) as a current of positive polarity, while a current flowing out of active filter 270 is assumed (arbitrarily) as a current of negative polarity.

Due to the operation described above, the current through capacitor 250 (Cz) is less than it would be otherwise, thereby effectively increasing the value of capacitance of capacitor 250 (Cz). A similar effect is achieved when signal 112D is at logic high. When signal 112D is at logic high, signal 217 (NDN) is at logic low, signal 112U (UP) is at logic low, and signal 218 (NUP) is at logic high. Transistor 214 is ON, while transistor 213 is OFF. Charge pump 290, therefore, sinks current from node 235. Transistor 211 is ON, while transistor 212 is OFF. Charge pump 280, therefore, sources current to node 245. Thus, while charge pump 290 injects a negative current proportional to a phase error between signals 101 and 151 to node 235 of active filter 270, charge pump 280 injects a positive current (i.e., draws a current) proportional to the phase error from node 245. The current through capacitor 250 (Cz) is less than it would be otherwise, thereby effectively increasing the value of capacitance of capacitor 250 (Cz).

Thus, capacitor 250 may be implemented with a relatively low capacitance, while still achieving a zero at a desired low frequency in the transfer function of PLL 100. Equations 1 and 2 below specify the transfer function of active filter 270. Equation 2 is obtained by re-arrangement of some of the terms of Equation 1.

$$VCTRL(s) = \frac{V_{DDA}}{(1+X)} \frac{\frac{R_z}{R_{cp1}} + \left(\frac{1}{R_{cp1}} - \frac{1}{R_{cp2}}\right)\frac{1}{sC_z}}{1 + sR_z\frac{C_pC_z}{C_p + C_z}} \quad \text{Equation 1}$$

$$VCTRL(s) = \frac{V_{DDA}}{(1+X)}\left(\frac{1}{R_{cp1}} - \frac{1}{R_{cp2}}\right)\frac{1}{sC_z} \frac{1 + \frac{sR_zC_z}{\left(1 - \frac{R_{cp1}}{R_{cp2}}\right)}}{1 + sR_z\frac{C_pC_z}{C_p + C_z}} \quad \text{Equation 2}$$

wherein,

VCTRL(s) represents the transfer function of active filter 270, and equals the voltage on output terminal 134 of OPAMP 230, $V_{DDA}$ represents power supply 201, $R_z$ represents the resistance of resistor 240, $R_{cp1}$ represents the resistance of resistor 221, $R_{cp2}$ represents the resistance of resistor 223, $C_z$ represents the capacitance of capacitor 250, $C_p$ represents the capacitance of capacitor 260, s represents the complex variable used in Laplace transforms, and X represents a factor by which the resistances of resistors 222, 224 and 226 are scaled with respect to resistances of resistors 221, 223 and 225 respectively.

The bandwidth of PLL 100 (with charge pump circuit 120 and LPF 130 implemented as shown in FIG. 2) is specified by the following equation:

$$BW = \frac{1}{2\pi} \frac{\frac{V_{DDA}}{(1+X)R_{cp2}} R_z K_{vco}}{N} \quad \text{Equation 3}$$

wherein,

BW represents the bandwidth of PLL 100, $V_{DDA}$, $R_z$, $R_{cp1}$ and X are as noted above with respect to equations 1 and 2, $K_{VCO}$ represents the transfer function of VCO 140, and N represents the divide factor set in frequency divider 150.

It may be observed from the term $$\frac{sR_zC_z}{\left(1 - \frac{R_{cp1}}{R_{cp2}}\right)}$$

in Equation 2 that capacitance Cz is effectively multiplied by a factor M specified by equation 4 below:

$$M = \frac{1}{\left(1 - \frac{R_{cp1}}{R_{cp2}}\right)} \quad \text{Equation 4}$$

The ratio (Rcp1/Rcp2) is always less than 1, so that M is a positive number.

Thus, capacitor 250 may be implemented to have a relatively low capacitance value than otherwise. In an embodiment, capacitance Cz has a value in the picoFarads (pF) range. It may be observed from equation 4 that multiplication factor M is determined by the ratio of resistances $R_{cp1}$ and $R_{cp2}$. Resistors can generally be implemented in integrated circuit form to have very low variations in resistance values over a wide range of process corners, operating voltages and operating temperature. In addition, the circuit of FIG. 2 (specifically charge pumps 280 and 290) are implemented without using active circuits such as, for example, OPAMPs or transistors. Therefore, output 145 of PLL 100 may be associated with a relatively smaller phase noise without a corresponding increase in area and power consumption in PLL 100.

The area of capacitor 250 (Cz) can be scaled down (reduced) by the multiplication factor M, thereby significantly reducing the area required for implementation of PLL 100. Since capacitance Cz is effectively multiplied with no additional noise penalty (i.e., with very low noise addition), the approach of FIG. 2 can also be used with high-bandwidth PLLs without degrading (or with minimal degradation in) the phase noise of such high-bandwidth PLLs.

The positioning of switches (i.e., transistors 211, 212, 213 and 214) in charge pumps 280 and 290, with connections of one terminal of each of the switches to either power supply 201 or ground 299, and without direct connection to output nodes 245 and 235, also provides corresponding benefits. For example, the ON resistance of the switches is lower due to larger values of gate-to-source voltage (Vgs) than if the switches were positioned to connect to nodes 245 or 235 directly. Another advantage with such positioning of the switches is that charge injection into or away from nodes 245 and 235 at instances of switching ON and switching OFF of the switches is avoided or minimized. Such charge injection might otherwise occur due to parasitic capacitance between the gate terminals of the switches and nodes 235 and 245. Hence, size (e.g., area) of the switches can be reduced, and undesired spurs in the spectrum of output signal 145 due to leakage currents in the switches may also be reduced.

The value of common-mode voltage (Vcm) generated by common-mode voltage generator 295 can be set to a value that is close to power-supply voltage 201 or ground potential 299. A value of Vcm that is very close to potential 201 or 299 enables capacitors 250 and 260 to be implemented as metal-oxide semiconductor (MOS) capacitors, and with smaller area than otherwise possible (i.e., if Vcm were not set close to power supply 201 or ground, or if capacitors 250 and 260 were implemented as metal capacitors). If the value of X were set to 1, Vcm would equal half of power supply voltage 201. For a power supply voltage 201 of 1.8V, Vcm would equal 0.9V. In steady state condition of PLL 100, voltage 245 may also be very close to 0.9V, As a result, DC bias voltage across capacitor 250 (Cz) as well as across capacitor 260 (Cp) may be close to zero volts (0V).

As is well-known in the relevant arts, capacitance values provided by MOS capacitors (polysilicon-to-N well or polysilicon-to-P well capacitors) exhibit a dependence on the voltage across the MOS capacitors. Due to the close-to-zero volt DC bias noted above, the capacitance of capacitors Cz (as well as Cp) may be less than a desired value (unless the capacitors are implemented to have larger areas). The implementation of common-mode voltage generator 295 to generate a Vcm value that is close to potential 201 or potential 299 enables a non-zero DC bias voltage to be maintained across capacitors 250 and 260, thereby enabling implementation of capacitors 250 and 260 as MOS capacitors of relatively smaller area. The resistance values of resistors 222 and 224 are correspondingly scaled by the value X with respect to resistors 221 and 223 respectively, as also noted above.

Another potential advantage of scaling Vcm is that OPAMP 230 can be optimized for noise and bandwidth without power penalty. If Vcm is not scaled, the biasing tail current of the input differential pair (whether implemented as NMOS input pair or PMOS input pair) within OPAMP 230 may operate in the triode region due to limited voltage head room available, thereby potentially leading to noise and bandwidth degradation. On the other hand, for example, if the value of X were set to 4/5, then for a power supply voltage 201 of 1.8V, Vcm (236) would equal 1.44V. Implementing OPAMP 230 with an NMOS input differential pair would provide sufficient voltage head room for the NMOS biasing tail current. If the value of X were set to 1/5, then for a power supply voltage 201 of 1.8V, Vcm (236) would equal 0.36V. Accordingly, implementing OPAMP 230 with a PMOS input differential pair provides sufficient voltage head room for the PMOS biasing tail current. Thus, scaling Vcm (236) ensures proper bias margins, and hence OPAMP 230 can be optimized for noise and bandwidth without any power penalty.

Output 145 of PLL 100, when implemented with the circuit of FIG. 2 in place of charge pump circuit 120 and LPF 130, may be sensitive to noise in power supply 201 coupling in through Vcm (path 236). An alternative embodiment of active filter 270 overcomes such a drawback, as described next with respect to FIG. 3.

3. Differential Active Loop Filter

Figure 3:
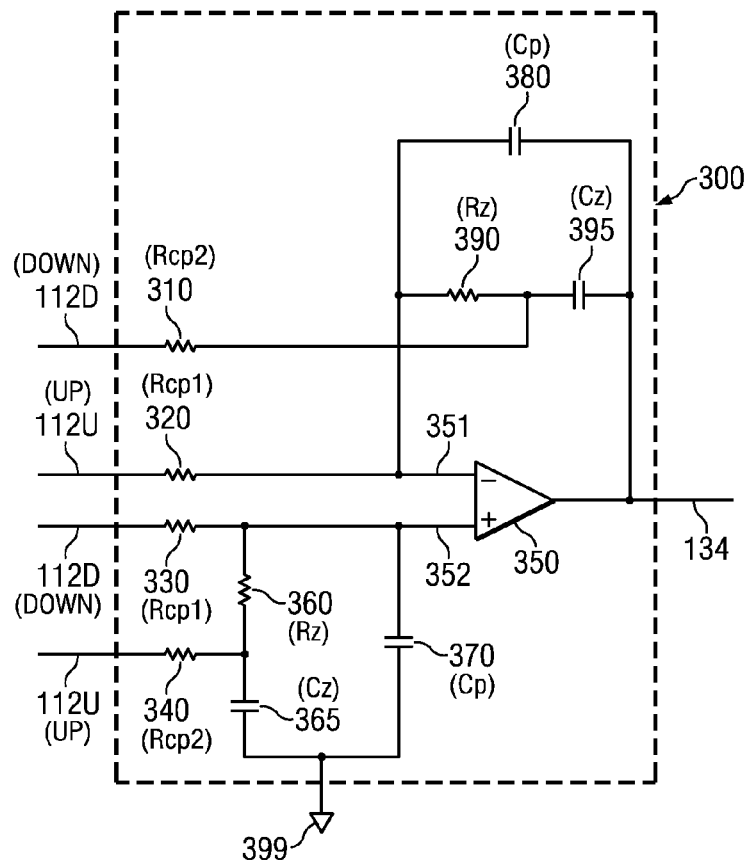
FIG. 3 is a diagram of a differential active filter used as a loop filter in a feedback circuit, in an embodiment.

FIG. 3 is a diagram of a differential active filter, in an embodiment. Differential active filter 300 may be used in place of LPF 130 of FIG. 1, and is shown containing resistors 310, 320, 330, 340, 360 and 390, OPAMP 350, and capacitors 365, 370, 380 and 395. Terminal 399 represents a ground terminal. The resistances of resistors 320 and 330 equal Rcp1 (of equation 2 above). The resistances of resistors 310 and 340 equal Rcp2 (of equation 2 above). The combination of resistor 390, capacitor 395 and capacitor 380 is connected between the inverting terminal 351 and output terminal 134 of OPAMP 350, and represents a low-pass filter. The combination of resistor 360, capacitor 365 and capacitor 370 is connected between the non-inverting terminal 352 of OPAMP 350 and ground 399, and also represents a low-pass filter. Resistance values of resistors 390 and 360 are each equal to Rz of Equation 2. Capacitance values of capacitors 365 and 395 are each equal to Cz of Equation 2. Capacitance values of capacitors 370 and 380 are each equal to Cp of Equation 2.

When differential active filter 300 is used in place of LPF 130, PLL 100 is implemented without charge pump circuit 120. Instead, UP (112U) and DOWN (112D) generated by PFD 110 are directly connected to filter 300, as shown in FIG. 3. The connection of signal 112D, via resistor 310, to the junction of resistor 390 and capacitor 395 (with signal 112U being connected, via resistor 320, to node 351), and the connection of signal 112U, via resistor 340, to the junction of resistor 360 and capacitor 365 (with signal 112D being connected, via resistor 330, to node 352) enables reduction of corresponding currents through capacitors 395 and 365. As a result, multiplication of capacitances Cz (395 and 365) of FIG. 3 is achieved in a manner similar to that described above with respect to FIG. 2.

Since filter 300 is implemented as a differential filter, there is no requirement to generate a common-mode voltage similar to Vcm of FIG. 2. Therefore, power-supply noise induced errors may not be present in output 145, when filter 300 is used as LPF 130.

In the illustrations of FIGS. 1, 2 and 3, although terminals/nodes are shown with direct connections to various other terminals, it should be appreciated that additional components (as suited for the specific environment) may also be present in the path, and accordingly the connections may be viewed as being electrically coupled to the same connected terminals.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, NMOS transistors and PMOS transistors may be swapped, while also interchanging the connections to power and ground terminals. Accordingly, in the instant application, the power and ground terminals are referred to as constant reference potentials, the source (emitter) and drain (collector) terminals (through which a current path is provided when turned ON and an open path is provided when turned OFF) of transistors are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A circuit comprising:
a first charge pump comprising a first pair of switches and a first pair of resistors, a junction of the resistors in the first pair of resistors forming a first node, wherein the first charge pump is operable to source a first current to the first node or to sink the first current from the first node by operation of the first pair of switches;
a second charge pump comprising a second pair of switches and a second pair of resistors, a junction of the resistors in the second pair of resistors forming a second node, wherein the second charge pump is operable to source a second current to the second node or to sink the second current from the second node by operation of the second pair of switches; and a filter comprising an impedance and a first capacitor coupled in series between a third node and a fourth node of the filter, wherein a junction of the impedance and the capacitor forms a fifth node of the filter, and a second capacitor coupled between the third node and the fourth node, in parallel with the series combination of the impedance and the first capacitor, wherein the first node is coupled to the third node and the second node is coupled to the fifth node, and wherein one said resistor of said first pair of resistors and one said resistor of said second pair of resistors are selected to bear a ratio to one another such that, in a transfer function of the filter, a capacitance value of the second capacitor is multiplied by a predetermined amount that corresponds to said ratio;

wherein the first capacitor determines a zero of the transfer function of the filter;

wherein the second charge pump sinks the second current from the second node when the first charge pump sources the first current to the first node;

wherein the second charge pump sources the second current to the second node when the first charge pump sinks the first current from the first node; and wherein the filter is an active filter and the impedance is provided by a first resistor, the second capacitor determining a pole of the transfer function of the active filter; and wherein the active filter further comprises a common-mode voltage generator to generate a common-mode voltage; and an operational amplifier (OPAMP), wherein an inverting terminal of the OPAMP is coupled to the third node, a non-inverting terminal of the OPAMP is coupled to the common-mode voltage, and an output terminal of the OPAMP is coupled to the fourth node.

2. The circuit of claim 1, wherein the common-mode voltage is generated to have a value to enable provision of a DC bias voltage across the first capacitor and the second capacitor, wherein each of the first capacitor and the second capacitor is implemented as a metal oxide semiconductor (MOS) capacitor.

3. The circuit of claim 1, wherein the first pair of switches comprises a first switch and a second switch, the first pair of resistors comprises a second resistor and a third resistor, wherein the second pair of switches comprises a third switch and a fourth switch, the second pair of resistors comprises a fourth resistor and a fifth resistor, wherein the first switch is coupled between a first constant reference potential and the second resistor, wherein the second switch is coupled between a second constant reference potential and the third resistor, wherein the third switch is coupled between the first constant reference potential and the fourth resistor, and wherein the fifth switch is coupled between the second constant reference potential and the fifth resistor.

4. The circuit of claim 1, wherein switches in each of the first pair of switches and the second pair of switches are controlled to be ON or OFF by signals generated by a phase frequency detector.

5. A phase locked loop (PLL) in integrated circuit (IC) form, the PLL comprising:

a phase frequency detector (PFD) coupled to receive an input clock and a local clock as inputs, the PFD to generate a pair of error signals comprising a first error signal and a second error signal, wherein the pulse widths of the first error signal and the second error signal are proportional respectively to the extent of lead and lag between the input clock and an output clock;

a charge pump circuit to receive the first error signal and the second error signal, and to generate corresponding current pulses;

a loop filter to perform low-pass filtering of the current pulses to generate a low-pass filtered signal;

a voltage controlled oscillator (VCO) coupled to receive the low-pass filtered signal and to generate the output clock, the frequency of the output clock being proportional to the voltage level of the low-pass filtered signal; and a frequency divider to divide the frequency of the output clock to generate the local clock, wherein the loop filter comprises a first resistor and a first capacitor coupled in series, and a second capacitor coupled in parallel with the series combination of the first resistor and the first capacitor, the first resistor and the first capacitor determining a zero of the transfer function of the loop filter, wherein the charge pump circuit simultaneously injects a first current pulse at a first node of the loop filter and a second current pulse at a second node of the loop filter, wherein the second node is a junction of the first resistor and the first capacitor, wherein the polarity of the first current pulse is the opposite of the polarity of the second current pulse, and wherein the charge pump circuit includes second and third resistors selected to bear a ratio to one another such that, in the transfer function of the loop filter, a capacitance value of the second capacitor is multiplied by a predetermined amount that corresponds to said ratio;

wherein the charge pump circuit comprises a first switch, a second switch, a third switch, a fourth switch, a fourth resistor and a fifth resistor, wherein the first switch is coupled between a first constant reference potential and the second resistor, wherein the second switch is coupled between a second constant reference potential and the fourth resistor, wherein the third switch is coupled between the first constant reference potential and the third resistor, and wherein the fifth switch is coupled between the second constant reference potential and the fifth resistor; and wherein the loop filter is an active filter, the second capacitor determining a pole of the transfer function of the active filter; and wherein the active filter further comprises:

a common-mode voltage generator to generate a common-mode voltage; and an operational amplifier (OPAMP), wherein an inverting terminal of the OPAMP is coupled to the first node, a non-inverting terminal of the OPAMP is coupled to the common-mode voltage, and an output terminal of the OPAMP is coupled to the third node.

6. The PLL of claim 5, wherein the common-mode voltage is generated to have a value to enable provision of a DC bias voltage across the first capacitor and the second capacitor, wherein each of the first capacitor and the second capacitor is implemented as a metal oxide semiconductor (MOS) capacitor.

* * * * *